(12) United States Patent
Kasko et al.

(10) Patent No.: US 8,284,596 B2
(45) Date of Patent: Oct. 9, 2012

(54) INTEGRATED CIRCUIT INCLUDING AN ARRAY OF DIODES COUPLED TO A LAYER OF RESISTANCE CHANGING MATERIAL

(75) Inventors: Igor Kasko, Dresden (DE); Thomas Happ, Dresden (DE); Andreas Walter, Dresden (DE); Stefan Tegen, Dresden (DE); Peter Baars, Dresden (DE); Klaus Muemmler, Dresden (DE)

(73) Assignee: Qimonda AG, Munich (DE)

( * ) Notice: Subject to any disclaimer, the term of this patent is extended or adjusted under 35 U.S.C. 154(b) by 1107 days.

(21) Appl. No.: 12/135,439

(22) Filed: Jun. 9, 2008

(65) Prior Publication Data

US 2009/0303780 A1  Dec. 10, 2009

(51) Int. Cl.
*G11C 11/00* (2006.01)
(52) U.S. Cl. ............... 365/163; 365/148; 977/754
(58) Field of Classification Search .......... 365/46, 365/94, 100, 113, 129, 148, 163; 257/2–5, 257/9, 296, 310, E21.35, E31.047, E27.006; 438/29, 95, 96, 166, 135, 240, 259, 365, 438/482, 486, 597, 785; 977/754
See application file for complete search history.

(56) References Cited

U.S. PATENT DOCUMENTS

| | | | |
|---|---|---|---|
| 6,563,156 B2 * | 5/2003 | Harshfield | 257/296 |
| 6,777,705 B2 * | 8/2004 | Reinberg et al. | 257/2 |
| 6,838,692 B1 | 1/2005 | Lung | |
| 6,969,633 B2 | 11/2005 | Dennison | |
| 6,995,446 B2 | 2/2006 | Karpov et al. | |
| 7,102,151 B2 * | 9/2006 | Reinberg et al. | 257/2 |
| 7,151,300 B2 | 12/2006 | Chang | |
| 7,214,958 B2 | 5/2007 | Happ | |
| 7,282,730 B2 | 10/2007 | Czubatyj et al. | |
| 7,382,647 B1 * | 6/2008 | Gopalakrishnan | 365/163 |
| 2001/0002046 A1 * | 5/2001 | Reinberg et al. | 257/3 |
| 2003/0001230 A1 | 1/2003 | Lowrey | |
| 2003/0186481 A1 * | 10/2003 | Lung | 438/95 |
| 2004/0114413 A1 * | 6/2004 | Parkinson et al. | 365/100 |
| 2005/0128785 A1 | 6/2005 | Kang | |
| 2006/0034116 A1 | 2/2006 | Lam et al. | |
| 2006/0151771 A1 | 7/2006 | Asano et al. | |
| 2006/0171194 A1 * | 8/2006 | Lowrey et al. | 365/154 |
| 2006/0186483 A1 | 8/2006 | Cho et al. | |
| 2006/0266991 A1 | 11/2006 | Chang et al. | |
| 2006/0284237 A1 | 12/2006 | Park et al. | |
| 2007/0173010 A1 | 7/2007 | Lee et al. | |
| 2007/0284622 A1 | 12/2007 | Ryoo et al. | |
| 2008/0025061 A1 * | 1/2008 | Scheuerlein et al. | 365/96 |
| 2008/0025068 A1 * | 1/2008 | Scheuerlein et al. | 365/148 |

(Continued)

OTHER PUBLICATIONS

"Evolution of Structural and Electrical Properties of Plasma Nitrided Silicon Oxynitrides During the Formation Process", Olaf Storbeck, Qimonda GmbH & Co., (10 pgs.).

(Continued)

*Primary Examiner* — Richard Elms
*Assistant Examiner* — Harry W Byrne
(74) *Attorney, Agent, or Firm* — Dicke, Billig & Czaja, PLLC (57) ABSTRACT

An integrated circuit includes an array of diodes and an electrode coupled to each diode. The integrated circuit includes a layer of resistance changing material coupled to the electrodes and bit lines coupled to the layer of resistance changing material. The layer of resistance changing material provides a resistance changing element at each intersection of each electrode and each bit line.

8 Claims, 10 Drawing Sheets

U.S. PATENT DOCUMENTS

| | | | |
|---|---|---|---|
| 2008/0025078 A1* | 1/2008 | Scheuerlein et al. | 365/163 |
| 2008/0025132 A1* | 1/2008 | Fasoli et al. | 365/230.06 |
| 2008/0232160 A1* | 9/2008 | Gopalakrishnan | 365/163 |
| 2008/0316808 A1* | 12/2008 | Herner et al. | 365/175 |

OTHER PUBLICATIONS

"Full Integration of Highly Manufacturable 512 Mb PRAM based on 90nm Technology", J.H. Oh, et al., IEEE 2006 (4 pgs.).

"Highly Reliable 50nm Contact Cell Technology for 256Mb PRAM", S. J. Ahn, et al., Advanced Technology Development, (2 pgs.), Jun. 2005 (VLSI Technology conference).

"OUM—180 nm Nonvolatile Memory Cell Element Technology for Stand Alone and Embedded Applications", Stefan Lai, et al., Intel Corporation (4 pgs.), Dec. 2001 (IEDM Conference).

"Ovonic Unified Memory—A High Performance Nonvolatile Memory Technology for Stand Alone Memory and Embedded Applications", Manzur Gill, et al., Intel Corporation (4 pgs.), Dec. 2002 (ISSCC conference).

"Polycrystalline Silicon-Germanium Heating Layer for Phase-Change Memory Applications", Seung-Yun Lee, et al., American Institute of Physics, 2006 (3 pgs.).

"Silicon-Based Thin Films as Bottom Electrodes in Chalcogenide Nonvolatile Memories", Seung-Yun Lee, et al., 2007 (4 pgs.).

"Ta2O5 Interfacial Layer Between GST and W Plug Enabling Low Power Operation of Phase Change Memories", Y. Matsui, et al., IEEE 2006 (4 pgs.).

* cited by examiner

INTEGRATED CIRCUIT INCLUDING AN ARRAY OF DIODES COUPLED TO A LAYER OF RESISTANCE CHANGING MATERIAL

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

Higher density phase change memories can also be achieved by reducing the physical size of each memory cell. Increasing the density of a phase change memory increases the amount of data that can be stored within the memory while at the same time typically reducing the cost of the memory.

For these and other reasons, there is a need for the present invention.

SUMMARY

One embodiment provides an integrated circuit. The integrated circuit includes an array of diodes and an electrode coupled to each diode. The integrated circuit includes a layer of resistance changing material coupled to the electrodes and bit lines coupled to the layer of resistance changing material. The layer of resistance changing material provides a resistance changing element at each intersection of each electrode and each bit line.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
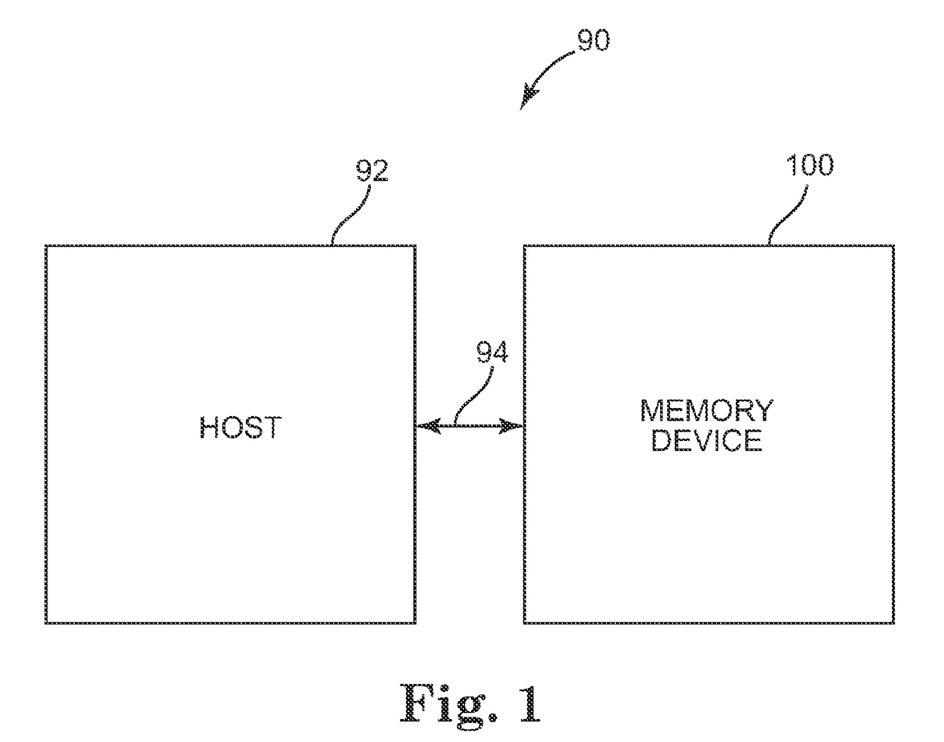
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a microprocessor, computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
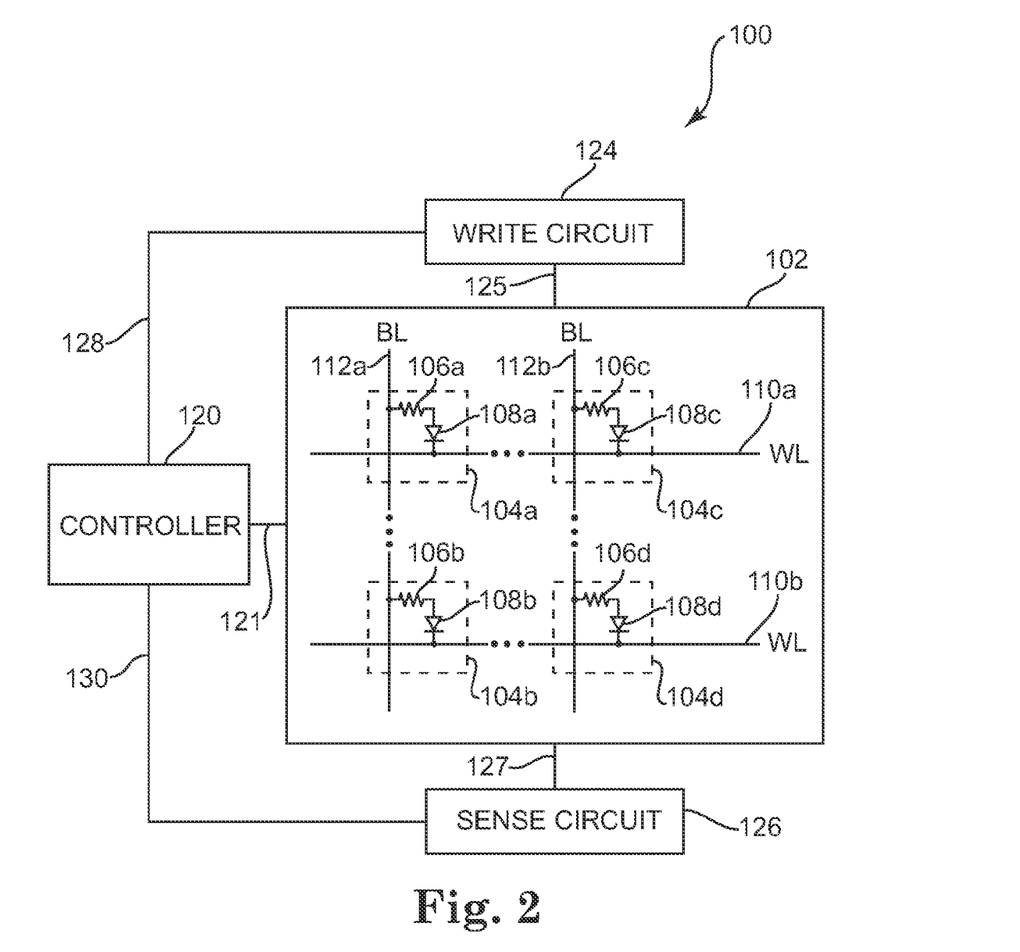
FIG. 2 is a diagram illustrating one embodiment of a memory device.

FIG. 2 is a diagram illustrating one embodiment of memory device 100. Memory device 100 includes a write circuit 124, a controller 120, a memory array 102, and a sense circuit 126. Memory array 102 includes a plurality of resistive memory cells 104a-104d (collectively referred to as resistive memory cells 104), a plurality of bit lines (BLs) 112a-112b (collectively referred to as bit lines 112), and a plurality of word lines (WLs) 110a-110b (collectively referred to as word lines 110). In one embodiment, resistive memory cells 104 are phase change memory cells. In other embodiments, resistive memory cells 104 are another suitable type of resistive memory cells or resistivity changing memory cells, such as transition-metal-oxide memory cells or peroskite memory cells.

Each memory cell 104 includes a phase change element 106 and a diode 108. By using diodes 108 to access bits within memory array 102, a $4F^2$ to $6F^2$ memory cell size is achieved, where "F" is the minimum lithographic feature size. Each phase change element 106 is a portion of a layer or plate of phase change material, which is coupled to diodes 108. In one embodiment, a silicon electrode is coupled to each diode, and each silicon electrode is coupled to the layer or plate of phase change material through a diffusion barrier.

As used herein, the term "electrically coupled" is not meant to mean that the elements must be directly coupled together and intervening elements may be provided between the "electrically coupled" elements.

Memory array 102 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110 and a bit line 112. Phase change memory cell 104a is electrically coupled to bit line 112a and word line 110a, and phase change memory cell 104b is electrically coupled to bit line 112a and word line 110b. Phase change memory cell 104c is electrically coupled to bit line 112b and word line 110a, and phase change memory cell 104d is electrically coupled to bit line 112b and word line 110b.

Each phase change memory cell 104 includes a phase change element 106 and a diode 108. Phase change memory cell 104a includes phase change element 106a and diode 108a. One side of phase change element 106a is electrically coupled to bit line 112a, and the other side of phase change element 106a is electrically coupled to one side of diode 108a. The other side of diode 108a is electrically coupled to word line 110a.

Phase change memory cell 104b includes phase change element 106b and diode 108b. One side of phase change element 106b is electrically coupled to bit line 112a, and the other side of phase change element 106b is electrically coupled to one side of diode 108b. The other side of diode 108b is electrically coupled to word line 110b.

Phase change memory cell 104c includes phase change element 106c and diode 108c. One side of phase change element 106c is electrically coupled to bit line 112b and the other side of phase change element 106c is electrically coupled to one side of diode 108c. The other side of diode 108c is electrically coupled to word line 110a.

Phase change memory cell 104d includes phase change element 106d and diode 108d. One side of phase change element 106d is electrically coupled to bit line 112b and the other side of phase change element 106d is electrically coupled to one side of diode 108d. The other side of diode 108d is electrically coupled to word line 110b.

In another embodiment, each phase change element 106 is electrically coupled to a word line 110 and each diode 108 is electrically coupled to a bit line 112. For example, for phase change memory cell 104a, one side of phase change element 106a is electrically coupled to word line 110a. The other side of phase change element 106a is electrically coupled to one side of diode 108a. The other side of diode 108a is electrically coupled to bit line 112a.

In one embodiment, each resistive memory element 106 is a phase change element that comprises a phase change material that may be made up of a variety of materials. Generally, chalcogenide alloys that contain one or more elements from Group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element may be changed from an amorphous state to a crystalline state or from a crystalline state to an amorphous state under the influence of temperature change. The amount of crystalline material coexisting with amorphous material in the phase change material of one of the phase change elements thereby defines two or more states for storing data within memory device 100. In the amorphous state, a phase change material exhibits significantly higher resistivity than in the crystalline state. Therefore, the two or more states of the phase change elements differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that are assigned multi-bit values, such as "00", "01", "10", and "1". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 102 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

In one embodiment, during a "set" operation of phase change memory cell 104a, one or more set current or voltage pulses are selectively enabled by write circuit 124 and sent through bit line 112a to phase change element 106a thereby heating phase change element 106a above its crystallization temperature (but usually below its melting temperature). In this way, phase change element 106a reaches its crystalline state or a partially crystalline and partially amorphous state during this set operation.

During a "reset" operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state.

Phase change memory cells 104b-104d and other phase change memory cells 104 in memory array 102 are set and reset similarly to phase change memory cell 104a using similar current or voltage pulses. In other embodiments, for other types of resistive memory cells, write circuit 124 provides suitable programming pulses to program the resistive memory cells 104 to the desired state.

Figure 3:
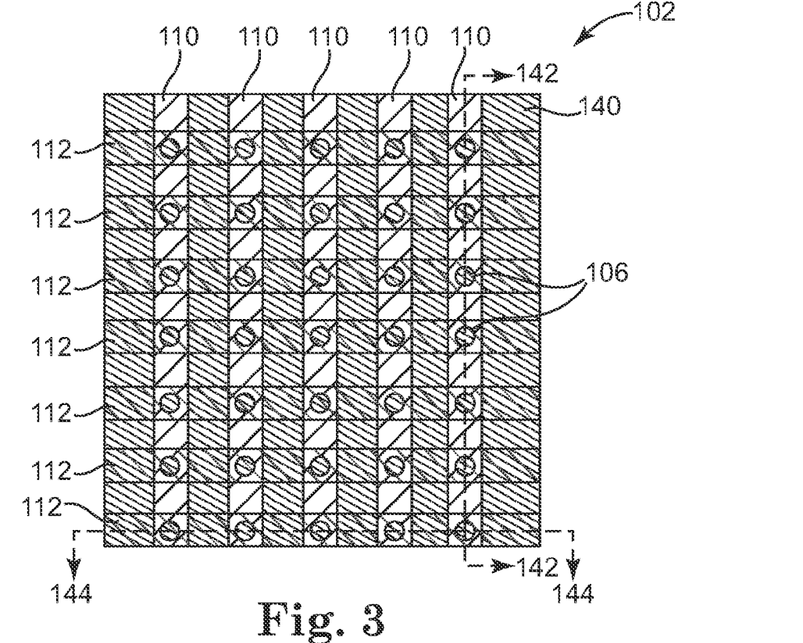
FIG. 3 illustrates a top view of one embodiment of a memory array.

FIG. 3 illustrates a top view of one embodiment of memory array 102. Memory array 102 includes word lines 110, bit lines 112, diodes (not shown), and a layer or plate of phase change material 140. In one embodiment, phase change material layer 140 extends over the entire array 102 and provides phase change elements 106. Each phase change element 106 is within phase change material layer 140 at the intersection of each word line 110 and each bit line 112. Each word line 110 is coupled to a diode, which is coupled to phase change material layer 140. Phase change material layer 140 is coupled to bit lines 112. In one embodiment, bit lines 112 are perpendicular to word lines 110.

Figure 4A:
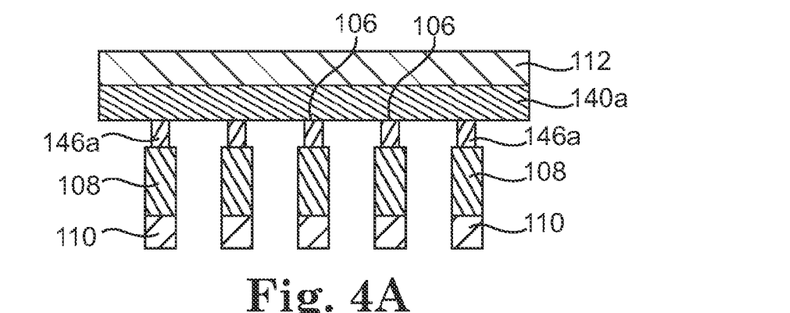
FIG. 4A illustrates a cross-sectional view of one embodiment of a memory array.
Figure 4B:
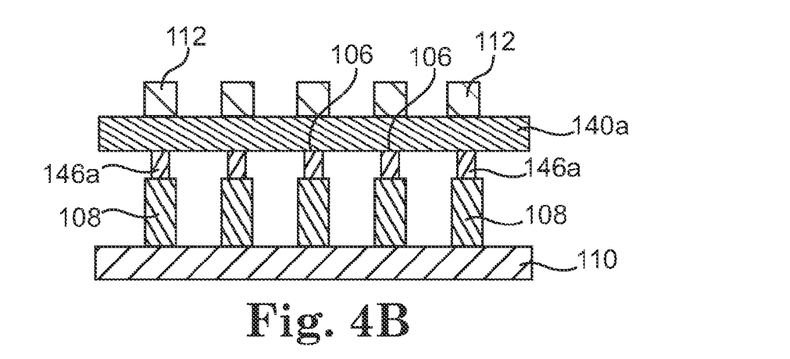
FIG. 4B illustrates a cross-sectional view of one embodiment of a memory array.

FIG. 4A illustrates a cross-sectional view of one embodiment of memory array 102 taken along 144 as indicated in FIG. 3. FIG. 4B illustrates a cross-sectional view of one embodiment of memory array 102 taken along 142 as indicated in FIG. 3. Each word line 110 is formed in a substrate, such as a silicon substrate or another suitable substrate. In one embodiment, each word line 110 is formed by appropriately doping portions of the substrate. The top of each word line 110 contacts the bottom of each vertical diode 108 along the word line. In one embodiment, each vertical diode 108 is formed in the substrate by appropriately doping portions of the substrate. In other embodiments, each vertical diode 108 is formed using an epitaxy process or another suitable process. The top of each vertical diode 108 is electrically coupled to the bottom of an electrode 146a. In one embodiment, each vertical diode 108 is electrically coupled to an electrode 146a through a silicide contact (not shown). The silicide contact includes CoSi, TiSi, NiSi, NiPtSi, WSi, TaSi, or other suitable silicide.

In one embodiment, each electrode 146a is a heater electrode and includes TiN, TaN, W, Al, Ti, Ta, TiSiN, TaSiN, TiAlN, TaAlN, Cu, WN, C, Si, or other suitable electrode material. The top of each electrode 146a contacts the bottom of phase change material layer 140a. Phase change material layer 140a is planar and has a substantially constant thickness across the array. Phase change material layer 140a is deposited over electrodes 146a using a sputter deposition, such as plasma vapor deposition (PVD) or another suitable deposition technique. Phase change material layer 140a is not etched and therefore is not at risk of being damaged.

A phase change element 106 is located in phase change material layer 140a at or near the interface between phase change material layer 140a and each electrode 146a. The top of phase change material layer 140a contacts bit lines 112, which extend over rows or columns of electrodes 146a. Each bit line 112 includes TiN, TaN, W, Al, Ti, Ta, TiSiN, TaSiN, TiAlN, TaAlN, Cu, WN, C, or other suitable material. Dielectric material (not shown) laterally surrounds word lines 110, diodes 108, electrodes 146a, and bit lines 112. The dielectric material includes $SiO_2$, $SiO_x$, SiN, SiON, $AlO_x$, fluorinated silica glass (FSG), boro-phosphorous silicate glass (BPSG), boro-silicate glass (BSG), or other suitable dielectric material.

In one embodiment, the current path through each memory cell is from a bit line 112 through phase change material layer 140a to an electrode 146a. From electrode 146a, the current flows through a vertical diode 108 to a word line 110. In another embodiment, the polarity of each diode 108 is reversed and the current path through each memory cell is reversed. The cross-sectional width of the interface area between phase change material layer 140a and each electrode 146a defines the current density through the interface and each phase change element 106 and thus the power used to program each memory cell. By reducing the cross-sectional width of the interface area, the current density is increased, thus reducing the power used to program each memory cell.

Figure 5A:
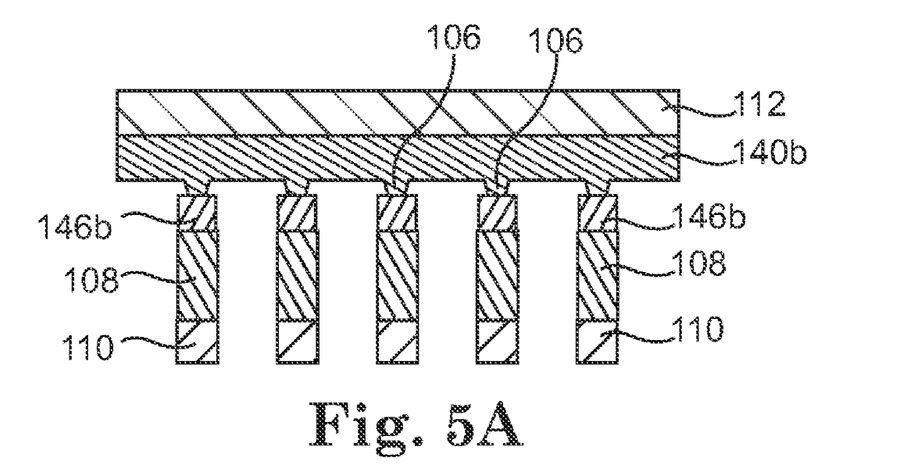
FIG. 5A illustrates a cross-sectional view of another embodiment of a memory array.
Figure 5B:
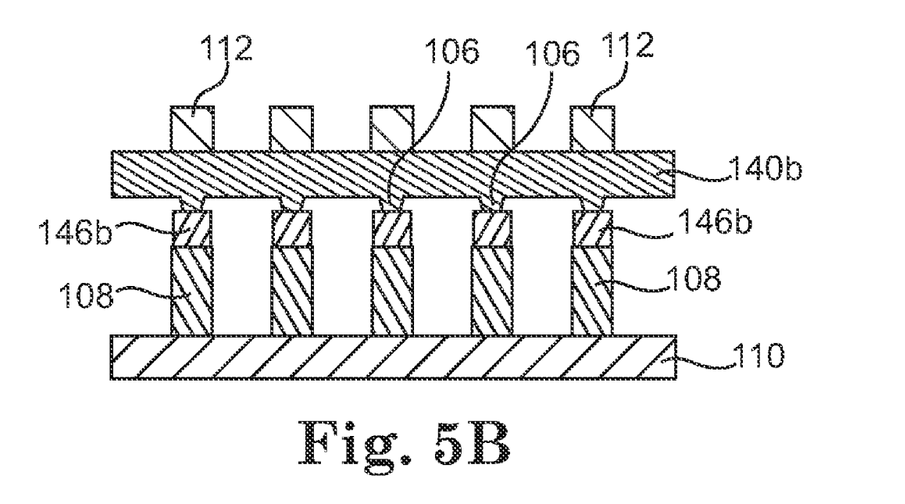
FIG. 5B illustrates a cross-sectional view of another embodiment of a memory array.

FIG. 5A illustrates a cross-sectional view of another embodiment of memory array 102 taken along 144 as indicated in FIG. 3. FIG. 5B illustrates a cross-sectional view of another embodiment of memory array 102 taken along 142 as indicated in FIG. 3. This embodiment is similar to the embodiment previously described and illustrated with reference to FIGS. 4A and 4B, except that in this embodiment electrodes 146a and phase change material layer 140a are replaced by electrodes 146b and phase change material layer 140b.

Phase change material layer 140b includes a planar portion that has a substantially constant thickness across the array and phase change elements 106 extending from the planar portion. Each phase change element 106 is laterally surrounded by dielectric material (not shown). In one embodiment, each phase change element 106 has tapered sidewalls. The bottom of each phase change element 106 contacts the top of an electrode 146b. In one embodiment, the cross-sectional width of each electrode 146b is greater than the cross-sectional width of each phase change element 106 at the interface between each phase change element 106 and each electrode 146b. Phase change material layer 140b is deposited over electrodes 146a using a sputter deposition, such as PVD or another suitable deposition technique. Phase change material layer 140b is not etched and therefore is not at risk of being damaged.

The following FIGS. 6-9 illustrate one embodiment for fabricating bit lines 112 without damaging phase change material layer 140.

Figure 6:
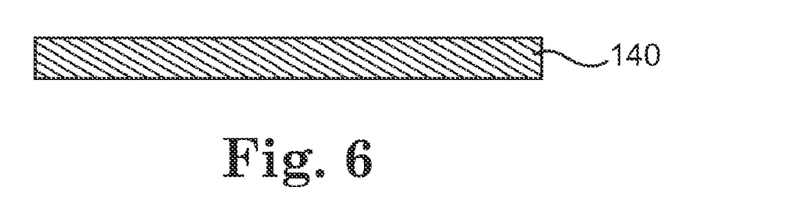
FIG. 6 illustrates a cross-sectional view of one embodiment of a phase change material layer.

FIG. 6 illustrates a cross-sectional view of one embodiment of a phase change material layer 140. A phase change material, such as a chalcogenide compound material or another suitable phase change material is deposited over electrodes, such as electrodes 146a as previously described and illustrated with reference to FIGS. 4A and 4B or electrodes 146b as previously described and illustrated with reference to FIGS. 5A and 5B to provide phase change material layer 140. Phase change material layer 140 is deposited using PVD or another suitable deposition technique.

Figure 7:
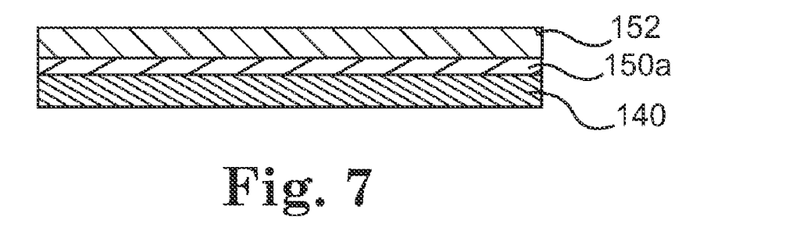
FIG. 7 illustrates a cross-sectional view of one embodiment of the phase change material layer, an etch stop material layer, and a conductive material layer.

FIG. 7 illustrates a cross-sectional view of one embodiment of phase change material layer 140, an etch stop material layer 150a, and a conductive material layer 152. An etch stop material, such as carbon or another suitable etch stop material is deposited over phase change material layer 140 to provide etch stop material layer 150a. Etch stop material layer 150a is deposited using chemical vapor deposition (CVD), high density plasma-chemical vapor deposition (HDP-CVD), atomic layer deposition (ALD), metal organic chemical vapor deposition (MOCVD), PVD, jet vapor deposition (JVD), or other suitable deposition technique.

A conductive material, such as TiN, TaN, W, Al, Ti, Ta, TiSiN, TaSiN, TiAlN, TaAlN, Cu, WN, or other suitable material is deposited over etch stop material layer 150a to provide conductive material layer 152. Conductive material layer 152 is deposited using CVD, HDP-CVD, ALD, MOCVD, PVD, JVD, or other suitable deposition technique.

Figure 8:
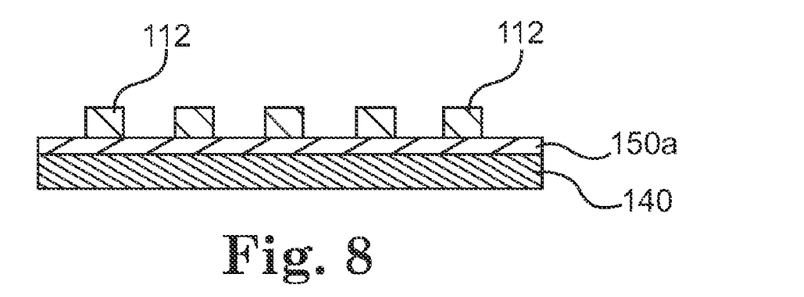
FIG. 8 illustrates a cross-sectional view of one embodiment of the phase change material layer, the etch stop material layer, and bit lines after etching portions of the conductive material layer.

FIG. 8 illustrates a cross-sectional view of one embodiment of phase change material layer 140, etch stop material layer 150a, and bit lines 112 after etching portions of conductive material layer 152. Conductive material layer 152 is patterned and etched to expose portions of etch stop material layer 150a and to provide bit lines 112.

Figure 9:
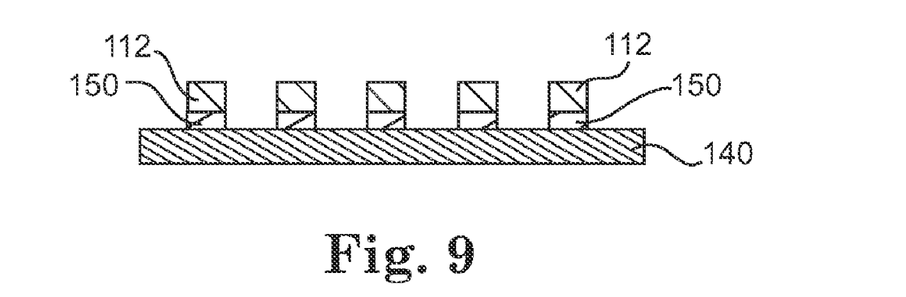
FIG. 9 illustrates a cross-sectional view of one embodiment of the phase change material layer, etch stop material, and the bit lines after removing portions of the etch stop material layer.

FIG. 9 illustrates a cross-sectional view of one embodiment of phase change material layer 140, etch stop material 150, and bit lines 112 after removing portions of etch stop material layer 150a. The exposed portions of etch stop material layer 150a are selectively removed to expose phase change material layer 140 and to provide etch stop material 150, which electrically couples bit lines 112 to phase change material layer 140. The exposed portions of etch stop material layer 150a are removed without damaging phase change material layer 140.

Figure 10A:
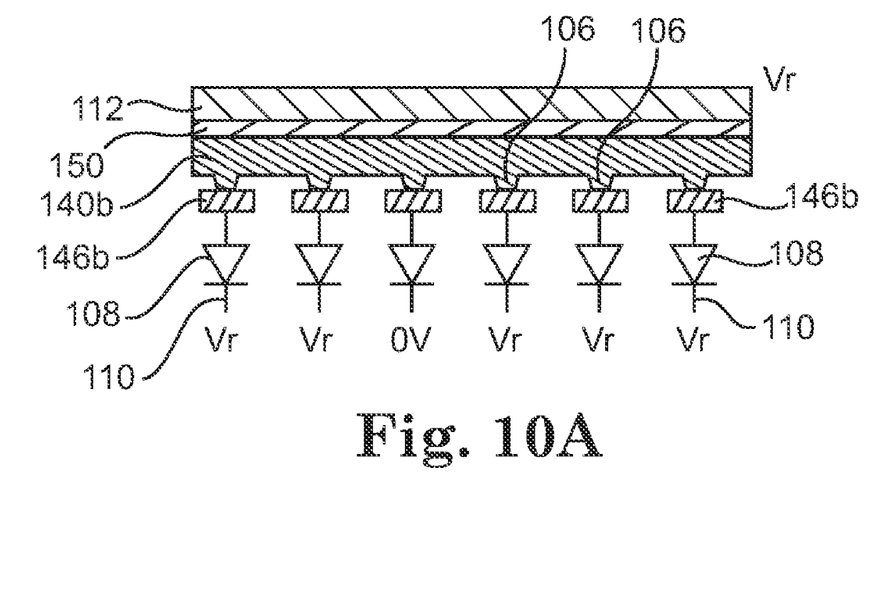
FIG. 10A is a diagram illustrating one embodiment of accessing a phase change element in a memory array.
Figure 10B:
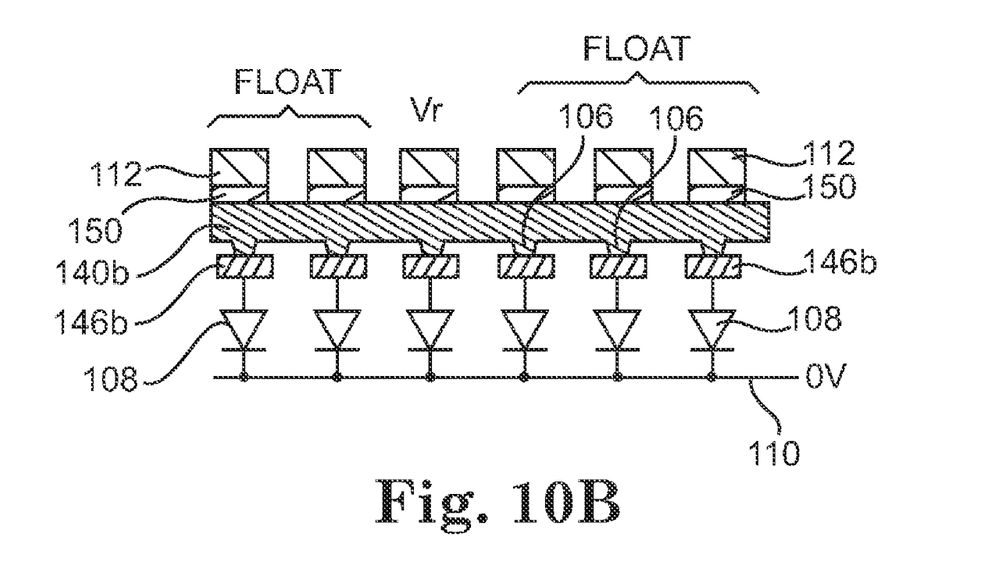
FIG. 10B is a diagram illustrating one embodiment of accessing a phase change element in a memory array.

FIGS. 10A and 10B are diagrams illustrating one embodiment of accessing a phase change element 106 in a memory array, such as memory array 102. The memory array includes word lines 110, diodes 108, electrodes 146b, phase change material layer 140b including phase change elements 106, etch stop material 150, and bit lines 112. Each word line 110 is electrically coupled to the cathode of a diode 108. The anode of each diode 108 is electrically coupled to an electrode 146b. Each electrode 146b is electrically coupled to a phase change element 106 within phase change material layer 140b. Phase change material layer 140b is electrically coupled to bit lines 112 through etch stop material 150.

To access a selected phase change element 106 for a read or write operation, a first voltage (Vr) is applied to the selected bit line that runs over the selected phase change element 106 to be accessed. The remaining unselected bit lines are left floating. A second voltage less than the first voltage, such as 0V is applied to the selected word line that is electrically coupled to the selected phase change element 106 to be accessed. The first voltage (Vr) is applied to the remaining unselected word lines. Therefore, current flows from the selected bit line 112 through the selected phase change element 106 to the selected electrode 146b, and from the selected electrode 146b through the selected diode 108 to the selected word line 110. Very little or no current flows through the remaining unselected phase change elements 106. By adjusting the first voltage (Vr), the selected phase change element 106 is read, programmed to the set state, or programmed to the reset state without substantially affecting the states of the unselected phase change elements 106. In one embodiment, the first voltage (Vr) is adjusted using a feed forward approach where the first voltage (Vr) is based on the state of unselected neighboring phase change elements 106.

In one embodiment, the memory array is programmed by using a page program mode. In the page program mode, phase change elements 106 are programmed in blocks. Each time a phase change element 106 is programmed, the other phase change elements along the selected bit line 112 and the selected word line 110 are also reprogrammed to their last programmed states. Therefore, any negative affect (e.g., thermal affect) that programming a selected phase change element 106 has on the state of a neighboring unselected phase change element 106 is avoided. In one embodiment, a block erase is used in the page program mode.

Figure 11A:
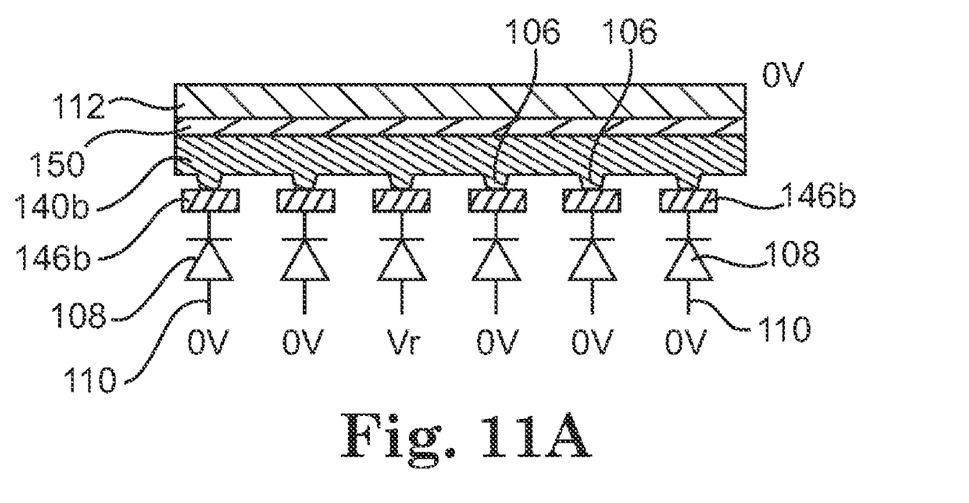
FIG. 11A is a diagram illustrating another embodiment of accessing a phase change element in a memory array.
Figure 11B:
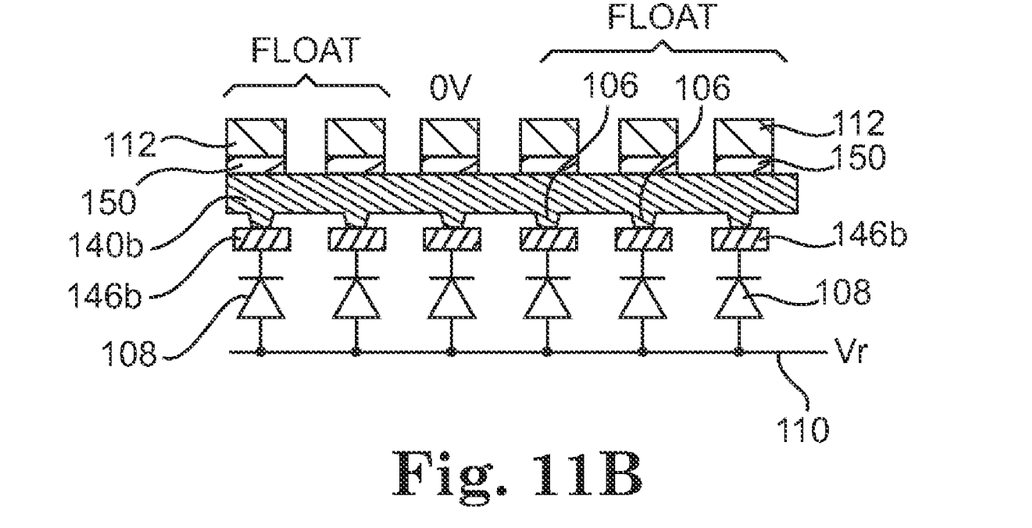
FIG. 11B is a diagram illustrating another embodiment of accessing a phase change element in a memory array.

FIGS. 11A and 11B are diagrams illustrating another embodiment of accessing a phase change element 106 in a memory array, such as memory array 102. The memory array is similar to the memory array previously described and illustrated with reference to FIGS. 10A and 10B, except that in this embodiment the polarity of diodes 108 is reversed.

To access a selected phase change element 106 for a read or write operation, a first voltage (Vr) is applied to the selected word line that is electrically coupled to the selected phase change element 106 to be accessed. A second voltage less than the first voltage, such as 0V is applied to the unselected word lines. The second voltage is also applied to the selected bit line running over the selected phase change element 106. The remaining unselected bit lines are left floating. Therefore, current flows from the selected word line 110 through the selected diode 108 to the selected electrode 146b, and from the selected electrode 146b through the selected phase change element 106 to the selected bit line 112. Very little or no current flows through the remaining unselected phase change elements 106. By adjusting the first voltage (Vr), the selected phase change element 106 is read, programmed to the set state, or programmed to the reset state without substantially affecting the states of the unselected phase change elements 106.

Figure 12:
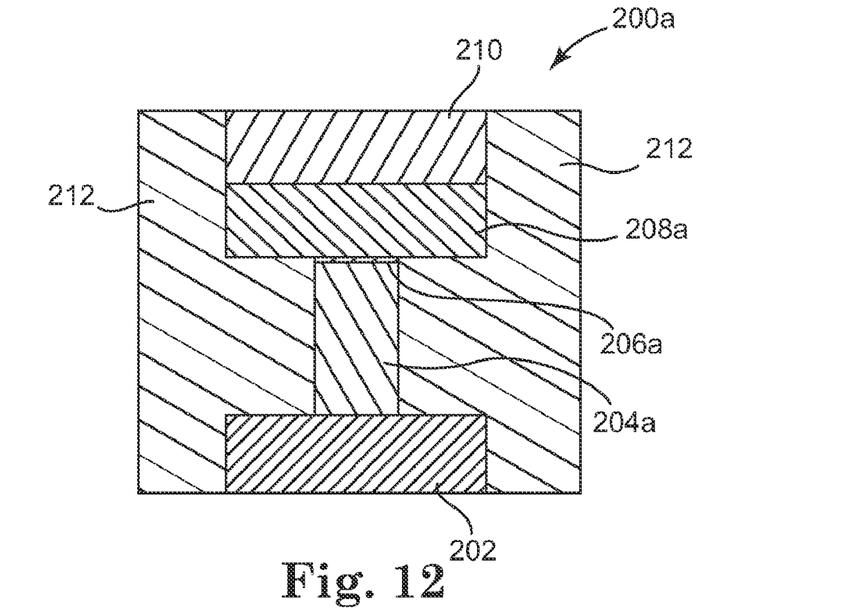
FIG. 12 illustrates a cross-sectional view of one embodiment of a memory cell.

FIG. 12 illustrates a cross-sectional view of one embodiment of a memory cell 200a. Memory cell 200a includes a contact 202, a first electrode 204a, and a diffusion barrier 206a, a phase change element 208a, a second electrode 210, and dielectric material 212. Contact 202 includes W, Cu, Al, or other suitable contact material. The top of contact 202 contacts the bottom of first electrode 204a. In one embodiment, first electrode 204a has a smaller cross-sectional width than contact 202. First electrode 204a includes silicon (e.g., polysilicon, SiGe, Si:C) or other suitable electrode material. In one embodiment, first electrode 204a is doped to adjust the resistivity of first electrode 204a.

The top of first electrode 204a contacts the bottom of diffusion barrier 206a. Diffusion barrier 206a includes nitrided silicon (i.e., SiN), $Al_2O_3$, MgO, $TaO_x$, or other suitable diffusion barrier material. Diffusion barrier 206a is thin such that during operation of memory cell 200a, current tunnels through diffusion barrier 206a when passing between first electrode 204a and phase change element 208a. The top of diffusion barrier 206a contacts the bottom of phase change element 208a. In one embodiment, phase change element 208a has a greater cross-sectional width than first electrode 204a and diffusion barrier 206a, such that first electrode 204a provides a heater electrode.

The top of phase change element 208a contacts the bottom of second electrode 210. In one embodiment, second electrode 210 has the same or a greater cross-sectional width than phase change element 208a. Second electrode 210 includes TiN, TaN, W, Al, Ti, Ta, TiSiN, TaSiN, TiAlN, TaAlN, WN, C, Cu, or other suitable electrode material. Dielectric material 212 laterally surrounds contact 202, first electrode 204a, diffusion barrier 206a, phase change element 208a, and second electrode 210. Dielectric material 212 includes $SiO_2$, $SiO_x$, SiN, SiON, $AlO_x$, FSG, BPSG, BSG, or other suitable dielectric material.

Diffusion barrier 206a prevents the diffusion of phase change material from phase change element 208a into first electrode 204a. In one embodiment, electrodes 146a previously described and illustrated with reference to FIGS. 4A and 4B are electrically coupled to phase change material layer 140a through a diffusion barrier. In another embodiment, electrodes 146b previously described and illustrated with reference to FIGS. 5A and 5B are electrically coupled to phase change material layer 140b through a diffusion barrier.

Phase change element 208a provides a storage location for storing one or more bits of data. During operation of memory cell 200a, current or voltage pulses are applied between first electrode 204a and second electrode 210 to program the memory cell. The active or phase change region in phase change element 208a is at or close to the interface area between diffusion barrier 206a and phase change element 208a.

During a set operation of memory cell 200a, one or more set current or voltage pulses are selectively enabled by write circuit 102 and sent to first electrode 204a or second electrode 210. From first electrode 204a or second electrode 210, the one or more set current or voltage pulses pass through phase change element 208a thereby heating the phase change material above its crystallization temperature (but usually below its melting temperature). In this way, the phase change material reaches a crystalline state or a partially crystalline and partially amorphous state during the set operation.

During a reset operation of memory cell 200a, a reset current or voltage pulse is selectively enabled by write circuit 102 and sent to first electrode 204a or second electrode 210. From first electrode 204a or second electrode 210, the reset current or voltage pulse passes through phase change element 208a. The reset current or voltage quickly heats the phase change material above its melting temperature. After the current or voltage pulse is turned off, the phase change material quickly quench cools into an amorphous state or a partially amorphous and partially crystalline state.

Figure 13:
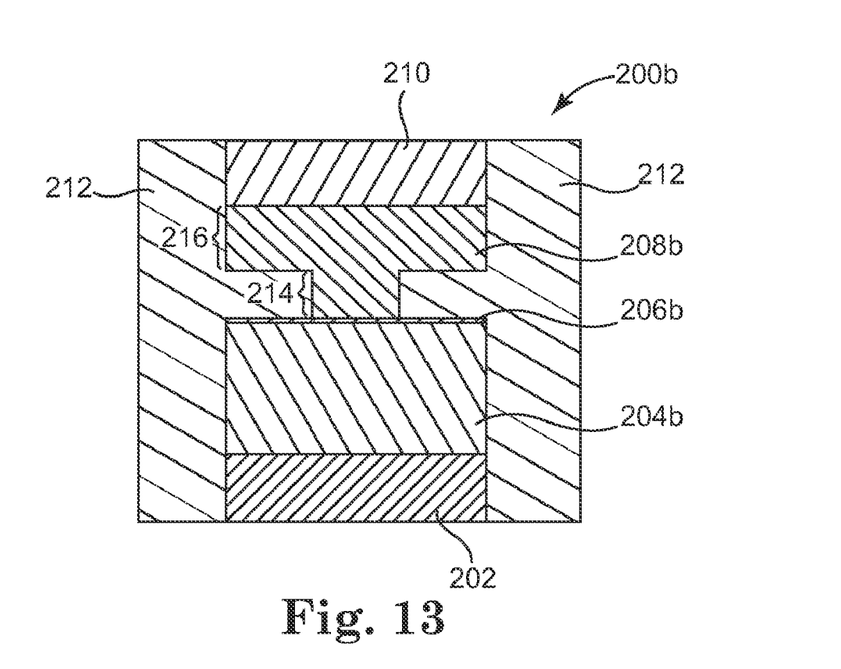
FIG. 13 illustrates a cross-sectional view of another embodiment of a memory cell.

FIG. 13 illustrates a cross-sectional view of another embodiment of a memory cell 200b. Memory cell 200b is similar to memory cell 200a previously described and illustrated with reference to FIG. 12, except that in memory cell 200b first electrode 204a, diffusion barrier 206a, and phase change element 208a are replaced with first electrode 204b, diffusion barrier 206b, and phase change element 208b.

In this embodiment, phase change element 208b includes a first portion 214 and a second portion 216. The cross-sectional width of first portion 214 is less than the cross-sectional width of second portion 216 and less than the cross-sectional width of first electrode 204b and diffusion barrier 206b. In one embodiment, the cross-sectional width of second portion 216 is the same as the cross-sectional width of second electrode 210. First portion 214 of phase change element 208b contacts diffusion barrier 206b, and second portion 216 of phase change element 208b contacts second electrode 210. The active or phase change region in phase change element 208b is at or close to first region 214 of phase change element 208b. Phase change memory cell 200b is programmed similarly to phase change memory cell 200a previously described and illustrated with reference to FIG. 12.

Figure 14:
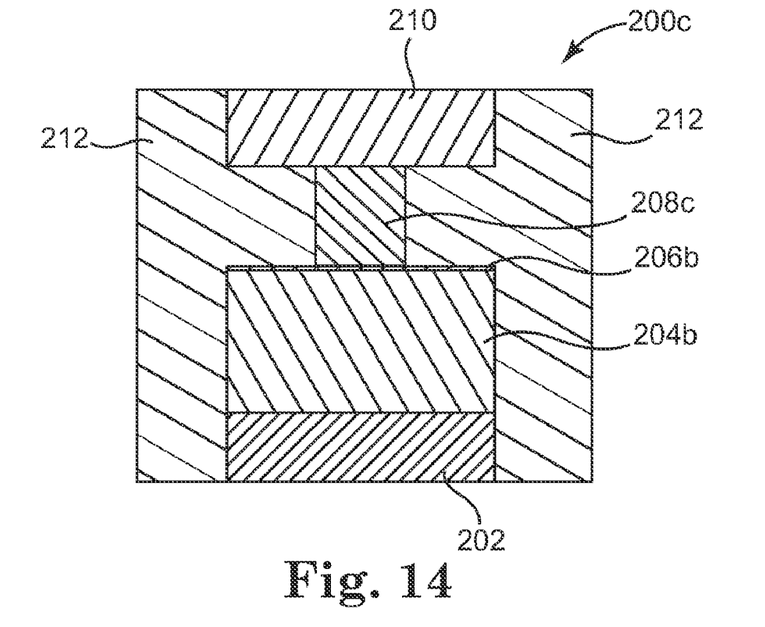
FIG. 14 illustrates a cross-sectional view of another embodiment of a memory cell.

FIG. 14 illustrates a cross-sectional view of another embodiment of a memory cell 200c. Memory cell 200c is similar to memory cell 200b previously described and illustrated with reference to FIG. 13, except that in memory cell 200c phase change element 208b is replaced with phase change element 208c.

In this embodiment, the cross-sectional width of phase change element 208c is less than the cross-sectional width of first electrode 204b and diffusion barrier 206b and less than the cross-sectional width of second electrode 210. The active or phase change region in phase change element 208c is at or close to the interface between phase change element 208c and diffusion barrier 206b. Phase change memory cell 200c is programmed similarly to phase change memory cell 200a previously described and illustrated with reference to FIG. 12.

Figure 15:
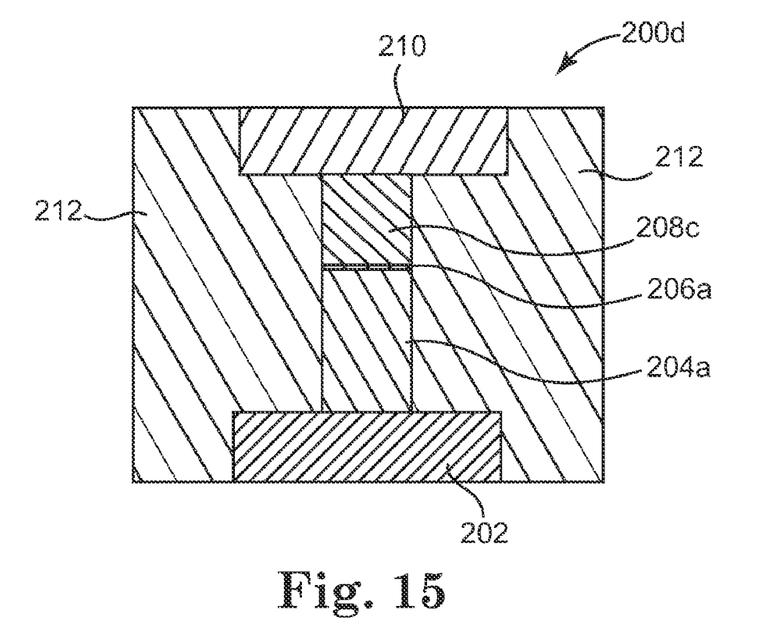
FIG. 15 illustrates a cross-sectional view of another embodiment of a memory cell.

FIG. 15 illustrates a cross-sectional view of another embodiment of a memory cell 200d. Memory cell 200d is similar to memory cell 200c previously described and illustrated with reference to FIG. 14, except that in memory cell 200d first electrode 204b and diffusion barrier 206b are replaced with first electrode 204a and diffusion barrier 206a.

In this embodiment, the cross-sectional width of phase change element 208c is the same as the cross-sectional width of first electrode 204a and diffusion barrier 206a. The active or phase change region in phase change element 208c is at or close to the interface between phase change element 208c and diffusion barrier 206a. Phase change memory cell 200d is programmed similarly to phase change memory cell 200a previously described and illustrated with reference to FIG. 12.

The following FIGS. 16-19 illustrate embodiments of a method for fabricating a phase change memory cell, such as a phase change memory cell 200a-200d as previously described and illustrated with reference to FIGS. 12-15.

Figures 16, 17:
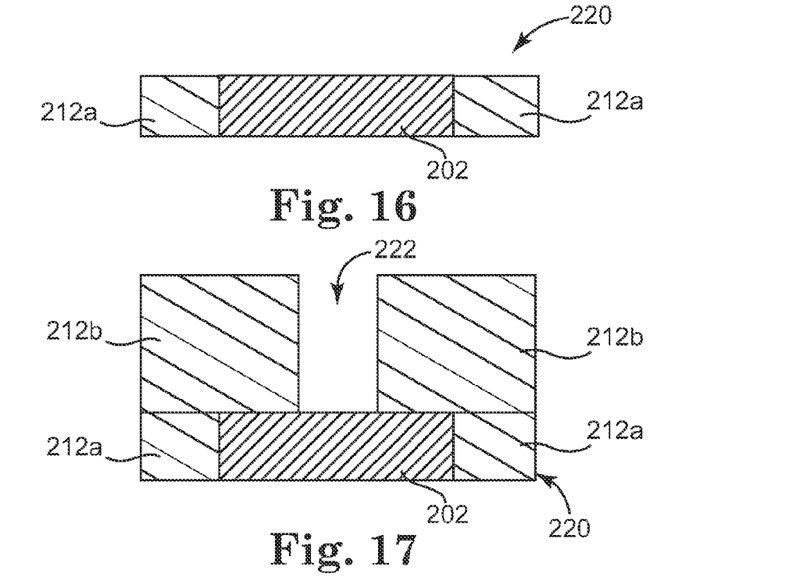
FIG. 16 illustrates a cross-sectional view of one embodiment of a preprocessed wafer.
FIG. 17 illustrates a cross-sectional view of one embodiment of the preprocessed wafer and a dielectric material layer.

FIG. 16 illustrates a cross-sectional view of one embodiment of a preprocessed wafer 220. Preprocessed wafer 220 includes a contact 202, dielectric material 212a, and lower wafer layers (not shown). Dielectric material 212a laterally surrounds contact 202 to isolate contact 202 from adjacent device features. Dielectric material 212a includes $SiO_2$, $SiO_x$, SiN, SiON, $AlO_x$, FSG, BPSG, BSG, or other suitable dielectric material. Contact 202 includes W, Cu, Al, or other suitable contact material.

FIG. 17 illustrates a cross-sectional view of one embodiment of preprocessed wafer 220 and a dielectric material layer 212b. A dielectric material, such as $SiO_2$, $SiO_x$, SiN, SiON, $AlO_x$, FSG, BPSG, BSG, or other suitable dielectric material is deposited over preprocessed wafer 220 to provide a dielectric material layer. The dielectric material layer is deposited using CVD, HDP-CVD, ALD, MOCVD, PVD, JVD, or other suitable deposition technique. A portion of the dielectric material layer is then etched to provide opening 222 exposing at least a portion of contact 202 and to provide dielectric material layer 212b.

Figure 18:
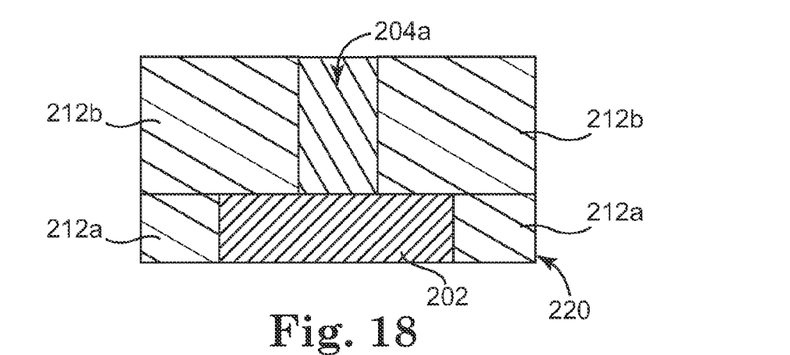
FIG. 18 illustrates a cross-sectional view of one embodiment of the preprocessed wafer, the dielectric material layer, and a first electrode.

FIG. 18 illustrates a cross-sectional view of one embodiment of preprocessed wafer 220, dielectric material layer 212b, and a first electrode 204a. An electrode material, such as polysilicon, SiGe, Si:C, or other suitable silicon electrode material is deposited over exposed portions of contact 202 and dielectric material layer 212b to provide an electrode material layer. The electrode material layer is then planarized to expose dielectric material layer 212b and to provide first electrode 204a. The electrode material layer is planarized using chemical mechanical planarization (CMP) or another suitable planarization technique. In one embodiment, first electrode 204a is doped with p-dopants or n-dopants to adjust the resistivity of first electrode 204a. In one embodiment, the resistivity of first electrode 204a is within the mOhmcm range.

Figure 19:
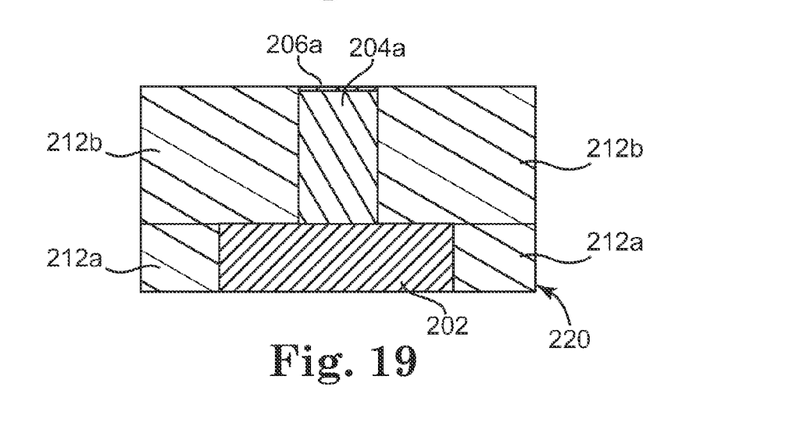
FIG. 19 illustrates a cross-sectional view of one embodiment of the preprocessed wafer, the dielectric material layer, the first electrode, and a diffusion barrier.

FIG. 19 illustrates a cross-sectional view of one embodiment of preprocessed wafer 220, dielectric material layer 212b, first electrode 204a, and a diffusion barrier 206a. In one embodiment, the top surface of first electrode 204a is nitrided to provide diffusion barrier 206a. The top surface of first electrode 204a is nitrided by plasma nitridation or by another suitable nitridation technique. In one embodiment, the thickness of diffusion barrier 206a is less than 2 nm. In another embodiment, a diffusion barrier material, such as $Al_2O_3$, MgO, $TaO_x$, or other suitable diffusion barrier material is deposited over first electrode 204a and dielectric material layer 212b to provide a diffusion barrier material layer. A portion of the diffusion barrier material layer is then etched to expose dielectric material layer 212b and to provide diffusion barrier 206a. Additional deposition and etching processes are then performed to fabricate a phase change element 208a-208c and a second electrode 210 as previously described and illustrated with reference to FIGS. 12-15.

Embodiments provide a resistive memory including resistance changing memory elements accessed by vertical diodes. The resistance changing memory elements are part of a continuous layer of resistance changing material. In one embodiment, the resistance changing material is coupled to electrodes through diffusion barriers to prevent the diffusion of the resistance changing material into the electrodes. In this way, a $4F^2$ to $6F^2$ memory cell can be fabricated.

While the specific embodiments described herein substantially focused on using phase change memory elements, the embodiments can be applied to any suitable type of resistance or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
an array of diodes;
an electrode coupled to each diode;
a continuous layer of phase change material coupled to the electrodes and extending over the array of diodes; and
bit lines coupled to the continuous layer of phase change material,
wherein the continuous layer of phase change material provides a phase change element at each intersection of each electrode and each bit line.

2. The integrated circuit of claim 1, further comprising:
an etch stop material coupling each bit line to the layer of phase change material.

3. The integrated circuit of claim 1, wherein each phase change element is laterally surrounded by dielectric material.

4. The integrated circuit of claim 1, further comprising:
a diffusion barrier coupling each electrode to the layer of phase change material,
wherein each electrode comprises silicon.

5. A system comprising:
a host; and
a memory device communicatively coupled to the host, the memory device comprising:
word lines;
vertical diodes coupled to each word line;
an electrode coupled to each vertical diode;
a continuous layer of phase change material coupled to the electrodes and extending over the vertical diodes; and
bit lines coupled to the continuous layer of phase change material,
wherein the continuous layer of phase change material provides a phase change element at each intersection of each word line and each bit line.

6. The system of claim 5, wherein the memory device further comprises:
an etch stop material coupling each bit line to the layer of phase change material.

7. The system of claim 5, wherein the memory device comprises a circuit configured to access a selected phase change element at an intersection of a selected bit line and a selected word line by:

applying a first voltage to the selected bit line with the unselected bit lines floating;
applying a second voltage to the selected word line; and
applying the first voltage to the unselected word lines,
wherein the first voltage is based on a state of a neighboring phase change element coupled to the selected word line.

8. The system of claim 5, wherein the memory device further comprises:
a diffusion barrier coupling each electrode to the layer of phase change material,
wherein each electrode comprises silicon.

\* \* \* \* \*